United States Patent [19]
Kouno et al.

[11] Patent Number: 5,313,207
[45] Date of Patent: May 17, 1994

[54] DIFFERENTIAL SUBTRACTER IMPROVED FOR HIGHER ACCURACY AND A/D CONVERTER INCLUDING THE SAME

[75] Inventors: Hiroyuki Kouno; Takahiro Miki; Toshio Kumamoto, all of Hyogo, Japan

[73] Assignee: Mitsubishi Denki Kabushiki Kaisha, Tokyo, Japan

[21] Appl. No.: 71,497

[22] Filed: Jun. 4, 1993

[30] Foreign Application Priority Data

Dec. 22, 1992 [JP] Japan .................................. 4-342091

[51] Int. Cl.$^5$ .............................................. H03M 1/12
[52] U.S. Cl. ..................................... 341/156; 330/252
[58] Field of Search ............... 341/156, 155, 143, 132, 341/127; 330/252; 323/265, 274

[56] References Cited
U.S. PATENT DOCUMENTS

| | | | |
|---|---|---|---|
| 4,511,852 | 4/1985 | Henrich et al. ..................... | 330/252 |
| 5,072,220 | 12/1991 | Petschacher et al. ............... | 341/156 |

OTHER PUBLICATIONS

Petschacher et al. "A 10-b 75-MSPS Subranging A/D Converter with Integrated Sample and Hold" IEEE Journal of Solid–State Circuits, vol. 25, No. 6 1990, pp. 1339–1346.

Shimizu et al. "A 10-Bit 20-MHz Two-Step Parallel A/D Converter with Internal S/H" IEEE Journal of Solid-State Circuits, vol. 24, No. 1 1989, pp. 13–20.

Nobuo Fujii "Analog Electronic Circuits", pp. 136–141 (with comments), 1989.

Primary Examiner—Brian K. Young
Attorney, Agent, or Firm—Lowe, Price, LeBlanc & Becker

[57] ABSTRACT

An improved differential subtracter 3a and an improved D/A converter 7a are used in a two-step parallel A/D converter 100. The D/A converter is responsive to complementary signals S1–S2 and B1–Bn indicative of results of conversion of higher bits to draw subtraction currents Is1 and Is2 through emitter electrodes of npn transistors Q1 and Q2. Since a difference between emitter currents $I_{E1}$ and $I_{E2}$ is small, base-emitter voltages $V_{BE1}$ and $V_{BE2}$ are substantially equal to each other. As a result, the A/D converter can execute the subtraction at high speed with high accuracy.

16 Claims, 10 Drawing Sheets

0 VOLT

DIFFERENTIAL SUBTRACTER IMPROVED FOR HIGHER ACCURACY AND A/D CONVERTER INCLUDING THE SAME

BACKGROUND OF THE INVENTION

1. Field of the Invention

The present invention relates in general to a differential subtracter circuit and an analog/digital converter, and in particular, to improvement of operation accuracy of a differential subtracter circuit and an analog/digital converter. The present invention is particularly applicable to an analog/digital converter of a two-step parallel type.

2. Description of the Background Art

Converters for converting analog signals into digital signals (referred to as "A/D converters" hereinafter) have been widely used for applying digital signal processing to the analog signals. High-speed processing of digital signals with high accuracy is required, for example, in a field of video signal processing, and therefore the high-speed conversion with high accuracy is required in the A/D converters.

A/D converters employing to various converting methods have been known. As is generally known, among them a two-step parallel A/D converter is suitable to signal processing for images requiring high definition. Such signal processing is required, for example, in high definition televisions, video tape recorders (VTRs) for business use and digital video cameras. Examples of the two-step parallel A/D converter are disclosed in:

(a) a paper entitled "A 10-b 75-MSPS Subranging A/D Converter with Integrated Sample and Hold" (IEEE Journal of Solid-State Circuits, Vol. 25, No. 6, Dec. 1990), and (b) a paper entitled "A 10-bit 20-MHz Two-Step Parallel A/D Converter with Internal S/H" (IEEE Journal of Solid-State Circuits, Vol. 24, No. 1, Feb. 1989).

FIG. 5 is a block diagram of a two-step parallel A/D converter in the prior art. The foregoing references have disclosed circuits similar to those of the A/D converter shown in FIG. 5. Referring to FIG. 5, an A/D converter 100 includes a sample hold circuit (S/H) 2, an A/D converter (ADC) 6 for higher bits, a D/A converter (DAC) 7 for higher bits, a subtracter 3, an A/D converter (ADC) 8 for lower bits, encoders 10a and 10b for higher and lower bits, and an output latch circuit 9.

The sample hold circuit 2 receives a differential input signal $\Delta Van$ to be converted into a digital signal, and supplies a sample-held differential signal $\Delta Vsh$. The differential signal $\Delta Vsh$ is defined by two held voltages V1 and V2. These voltages V1 and V2 are supplied to the differential subtracter 3 and the A/D converter 6. An externally applied differential reference voltage $\Delta Vref$ is supplied to a coarse reference voltage generating circuit 5a and the D/A converter 7. The A/D converter 6 compares the differential voltage signal $\Delta Vsh$ with a coarse reference voltage Vcr to convert the differential voltage signal $\Delta Vsh$ into complementary digital signals (thermometer codes) S1-S8 and B1-B8, which are applied to the D/A converter 7 and encoder 10a.

The D/A converter 7 is responsive to the applied complementary digital signals S1-S8 and B1-B8 to supply corresponding differential current signals Is1 and Is2, which correspond to converted higher bit signal.

The differential subtracter 3 subtracts the differential current signals Is1 and Is2 from differential current signal (not shown) corresponding to the differential voltage signal $\Delta Vsh$. Differential subtraction signals Vo1 and Vo2 showing a result of subtraction are applied to the A/D converter 8.

A fine reference voltage generating circuit 5b applies a plurality of fine reference voltages Vfr to the A/D converter 8. The A/D converter 8 compares the differential subtraction signals Vo1 and Vo2 with the applied fine reference voltages. Lower bit signals (thermometer codes) showing results of comparison are applied to the lower bit encoder 10b.

The encoders 10a and 10b convert the applied thermometer codes of higher bits and the applied thermometer codes of lower bits, e.g., into straight binary codes, and data signals thus converted are applied to the output latch circuit 9. The output latch circuit 9 supplies the received data signals as output data signals D1, D2, . . . , Dm.

FIG. 6 is a circuit diagram showing the coarse reference voltage generating circuit 5a and the higher bit A/D converter 6. Referring to FIG. 6, the coarse reference voltage generating circuit 5a includes a ladder resistor circuit formed of resistors 501-509 connected in series. The externally received differential reference voltage $\Delta Vref$ is applied across opposite ends of the ladder resistor circuit. The coarse reference voltage generating circuit 5a supplies coarse reference voltages Vcr1-Vcr8 through common connection nodes, each of which is common to adjacent two resistors, respectively.

The A/D converter 6 includes comparators 61-68 each receiving the differential voltage signal $\Delta Vsh$. The comparators 61-68 receive the corresponding coarse reference voltages Vcr1-Vcr8 to compare the differential voltage signal $\Delta Vsh$ with the corresponding coarse reference voltages Vcr1-Vcr8, respectively. The A/D converter 6 supplies the complementary digital signals (thermometer codes) S1-S8 and B1-B8 indicative of the result of comparison. The signals S1-S8 are complementary with the corresponding signals B1-B8, respectively. The complementary signals S1-S8 and B1-B8 are applied to the A/D converter 7 in FIG. 5 and are also applied to the higher bit encoder 10a.

FIG. 7 is a circuit diagram of the fine reference voltage generating circuit 5b shown in FIG. 5. Referring to FIG. 7, the fine reference voltage generating circuit 5b includes a differential amplifier 510, a constant current supply circuit 520, an input resistor 511, and a ladder resistor circuit 517. The constant current supply circuit 520 includes npn transistors 512 and 513, emitter resistors 514 and 515, and a constant current supply 516. By the function of constant current supply circuit 520, a current If flows through the input resistor 511. A voltage difference between opposite ends of the input resistor 511 is applied to the differential amplifier 510 through terminals + and −.

The differential output voltage of the differential amplifier 510 is applied across the opposite ends of the ladder resistor circuit 517, which in turn supplies fine reference voltages Vfr1-Vfr8. The fine reference voltages Vfr1-Vfr8 subdivides one voltage range among those of the coarse reference voltages Vcr1-Vcr8 shown in FIG. 6. The fine reference voltages Vfr1–Vfr8 are applied to the A/D converter 8.

FIG. 8 is a circuit diagram of the differential subtracter circuit 3 and D/A converter 7 in the prior art shown in FIG. 5. Referring to FIG. 8, the D/A converter 7 includes the subtraction current generating circuits 71, 72, ..., 7n. Each of the subtraction current generating circuits 71–7n draws in the current through one of current lines CL1 and CL2 in response to corresponding one pair of the complementary digital signals B1 and S1, B2 and S2, ..., Bn and Sn. Therefore, the D/A converter 7 receives the corresponding subtraction currents Is1 and Is2 from the differential subtracter 3 in response to signals indicative of the result of conversion of the higher bits, i.e., the complementary digital signals S1–Sn and B1–Bn.

The differential subtracter 3 includes npn transistors Q1 and Q2, emitter resistors $R_{E1}$ and $R_{E2}$, collector resistors Rc1 and Rc2, and a current supply CS0. The transistor Q1 has a base electrode receiving an output voltage V1 from the sample hold circuit 2. The transistor Q2 has a base electrode receiving an output voltage V2.

FIG. 9 is a signal waveform diagram showing an operation of the differential subtracter 3 shown in FIG. 5. It is assumed that a differential input voltage $\Delta Van$ having a triangular waveform shown in FIG. 9 is applied to the A/D converter 100 shown in FIG. 5. Thus, the sample hold circuit 2 applies the differential voltages V1 and V2 shown in FIG. 9 to the differential subtracter 3. FIG. 9 shows a current Iv1 corresponding to the voltage V1.

The D/A converter 7 shown in FIG. 5 supplies the differential current signals Is1 and Is2 corresponding to the result of conversion of the higher bits. The differential current signal Is1 is shown in FIG. 9. The current signals Iv1 and Is1 each are applied to the differential subtracter 3 shown in FIG. 5, and the subtraction is executed between the current signals Iv1 and Is1. The differential voltage signals indicative of the result of subtraction, i.e., the differential subtraction signals Vo1 and Vo2 are shown in FIG. 9.

The differential voltage signals Vo1 and Vo2 are applied to the lower bit A/D converter 8, and are subjected to the conversion by the A/D converter 8, using the fine reference voltage Vfr. The conversion by the lower bit A/D converter 8 is similar to that by the higher bit A/D converter 6, and thus description is not repeated.

Referring to FIG. 9 again, the subtraction by the differential subtracter 3 will be described below in view of a circuit operation. In the following description, "$I_{E1}$" and "$I_{E2}$" indicate emitter currents of the transistors Q1 and Q2, respectively. "Ic1" and "Ic2" indicate collector currents of the same, respectively. "$V_{BE1}$" and "$V_{BE2}$" indicate the base-emitter voltages. "$V_x$" indicates a voltage at a common node of emitter resistors $R_{E1}$ and $R_{E2}$ each having a resistance $R_E$. It is also assumed that a constant current 2·I0 flows through the constant current supply CS0 and that the resistors Rc1 and Rc2 each have a resistance Rc.

In the case where the voltage signal V1 is equal to the voltage signal V2 (V1=V2), there exists a relationship of $I_{E1}=I_{E2}=Tc1=Tc2=I0$. Owing to relationships of Vo1=Vcc−Rc·Ic1 and Vo2=Vcc−Rc·Ic2, the output voltages Vo1 and Vo2 have the same voltage level.

In the case where the voltage V1 is larger than the voltage V2 (V1>V2), there exist following relationships.

$$I_{E1}=(V1-V_{BE1}-V_x)/R_E=IC1 \tag{1}$$

$$I_{E2}=(V2-V_{BE2}-V_x)/R_E=IC2 \tag{2}$$

$$Vo1=Vcc-Rc \cdot Ic1 \tag{3}$$

$$Vo2=Vcc-Rc \cdot Ic2 \tag{4}$$

In this case, since the collector current Ic1 is larger than the collector current Ic2 (Ic1>Ic2), the output voltages Vo1 and Vo2 have a relationship of Vo1<Vo2.

In addition to the basic differential operation described above, the differential subtracter 3 carries out the subtraction for the subtraction currents Is1 and Is2. In the case of V1>V2, the subtraction currents Is1 and Is2 having the relationship of Is1<Is2 are drawn from the differential subtracter 3 into the D/A converter 7. This changes ranges of the output voltages Vo1 and Vo2 of the differential subtracter 3 into ranges which allow processing by the lower bit A/D converter 8.

Meanwhile, in the case of V1<V2, a similar operation is carried out in a manner opposite to the foregoing. In this case, the subtraction currents having the relationship of Is1>Is2 are drawn from the differential subtracter 3 into the D/A converter 7, and the ranges of the output voltages Vo1 and Vo2 are likewise changed into ranges for the lower bit A/D converter 8.

As described above, the subtraction using the subtraction currents Is1 and Is2 reduces the difference (=|Ic1−IC2|) between the collector currents Ic1 and Ic2 into a very small value. Meanwhile, the emitter currents $I_{E1}$ and $I_{E2}$ are increased and reduced in response to the corresponding applied base currents V1 and V2, respectively. Therefore, a large difference may be generated between the emitter currents $I_{E1}$ and $I_{E2}$ in some cases. More specifically, when the applied differential voltage defined by the voltage signals V1 and V2 is large, one of the emitter currents $I_{E1}$ and $I_{E2}$ becomes large and the other becomes small. Imbalance between the emitter currents $I_{E1}$ and $I_{E2}$ may cause the following disadvantage.

In general, the base/emitter voltage $V_{BE}$ can be expressed by the following expressions.

$$V_{BE}=V_T ln\ (\alpha \cdot I_E/Isat) \tag{5}$$

$$I_{E1}=I0+I_R \tag{6}$$

$$I_{E2}=I0-I_R \tag{7}$$

$$I_R=\{(V1-V_{BE1})-(V2-V_{BE2})\}/R_E \tag{8}$$

where $V_T$ is a thermal voltage, $\alpha$ is a current amplification rate, and Isat is a saturation current.

From the expression (5), it can be understood that the base-emitter voltage $V_{BE}$ of the transistor is a function of the emitter current $I_E$. Therefore, the difference between the base-emitter voltages $V_{BE1}$ and $V_{BE2}$ cannot be ignored if the emitter current $I_{E1}$ is much larger than the emitter current $I_{E2}$ in the differential subtracter 3 shown in FIG. 8.

More specifically, as can be seen from the foregoing expressions (1) and (2), since the collector currents Ic1 and Ic2 are functions of the voltages $V_{BE1}$ and $V_{BE2}$, the difference between the voltages $V_{BE1}$ and $V_{BE2}$ affects the collector currents Ic1 and IC2. The collector currents Ic1 and Ic2 are varied by the input voltages V1 and V2 as well as the voltages $V_{BE1}$ and $V_{BE2}$, so that the differential subtracter 3 cannot execute the accurate subtraction. In other words, the accuracy in the subtraction deteriorates. This reduces the accuracy in the A/D conversion of the lower bits.

Additionally, there is a second disadvantage described below. For simplicity, it is assumed that both the subtraction currents Is1 and Is2 shown in FIG. 8 are 0 in the following description. FIG. 10 is a waveform diagram showing the changes of the differential input voltage ΔVan and differential output voltages Vo1 and Vo2 in this case. For example, at time t1, the differential input voltage ΔVan (=V1−V2) is maximum. At this time, the output voltage Vo2 nearly attains the supply voltage level Vcc, and the output voltage Vo1 equals to Vcc−2·Rc·I0.

FIG. 11 is an enlarged waveform diagram showing the output voltages Vo1 and Vo2 shown in FIG. 10. For example, the output voltage Vo2 has an amplitude of 2·Rc·I0, as shown in FIG. 11. As described above, the A/D conversion for the lower bits is carried out after the subtraction with the subtraction currents indicative of the result of A/D conversion of the higher bits. In FIG. 11, therefore, there is a delay Δt′ from the sampling of the input voltage at time t11 to the output of the output voltage Vo2 indicative of the result of subtraction at time t13. The existence of the delay time Δt′ prevents the accurate subtraction in the differential subtracter 3. In particular, this disadvantage becomes significant in the A/D converter requiring a high operation speed.

SUMMARY OF THE INVENTION

An object of the invention is to improve subtraction accuracy in a differential subtracter.

Another object of the invention is to improve conversion accuracy in an A/D converter including a differential subtracter.

Still another object of the invention is to improve conversion accuracy in a two-step parallel A/D converter including a differential subtracter.

In summary, the present invention provides a differential subtracter circuit for subtracting a second differential signal defined by third and fourth input signals from a first differential signal defined by first and second input signals. The differential subtraction circuit includes a first bipolar transistor having a base electrode connected to receive the first input signal and an emitter electrode connected to receive the third input signal, a second bipolar transistor having a base electrode connected to receive the second input signal and an emitter electrode connected to receive the fourth input signal, a first constant current supply connected between a first supply potential and the emitter electrode of the first bipolar transistor, a second constant current supply connected between the first supply potential and the emitter electrode of the second bipolar transistor, a first resistor connected between a second supply potential and a collector electrode of the first bipolar transistor, and a second resistor connected between the second supply potential and a collector electrode of the second bipolar transistor. A subtraction differential signal indicative of a result of subtraction is output through the collector electrodes of the first and second bipolar transistors.

In operation, the third and fourth input signals defining the second differential signal are drawn through the emitter electrodes of the first and second bipolar transistors, respectively. Therefore, a difference between the emitter currents of the first and second bipolar transistors is small, compared with a conventional differential subtracter circuit, so that base-emitter voltages of the first and second bipolar transistors are substantially equal to each other. This enables the subtraction with high accuracy.

According to another aspect, the invention provides an A/D converter for converting an input differential signal defined by first and second input signals into a digital signal including a higher bit signal and a lower bit signal. The A/D converter includes a circuit for generating a plurality of coarse reference voltages and a plurality of fine reference voltages for A/D conversion, a first A/D converter circuit for comparing the input differential signal with the plurality of coarse reference voltages to supply the higher bit signal, a D/A converter circuit for converting the higher bit signal into a corresponding middle differential signal, a differential subtracter for subtracting the middle differential signal from the input differential signal to supply a subtraction differential signal, and a second A/D converter circuit for comparing the subtraction differential signal with the plurality of fine reference voltages to supply the lower bit signal. The middle differential signal is defined by first and second middle signals. The differential subtraction circuit includes a first bipolar transistor having a base electrode connected to receive the first input signal and an emitter electrode connected to receive the first middle signal, a second bipolar transistor having a base electrode connected to receive the second input signal and an emitter electrode connected to receive the second middle signal, a first constant current supply connected between a first supply potential and the emitter electrode of the first bipolar transistor, a second constant current supply connected between the first supply potential and the emitter electrode of the second bipolar transistor, a first resistor connected between a second supply potential and a collector electrode of the first bipolar transistor, and a second resistor connected between the second supply potential and a collector electrode of the second bipolar transistor. The subtraction differential signal is supplied to the second A/D converter through the collector electrodes of the first and second bipolar transistors.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
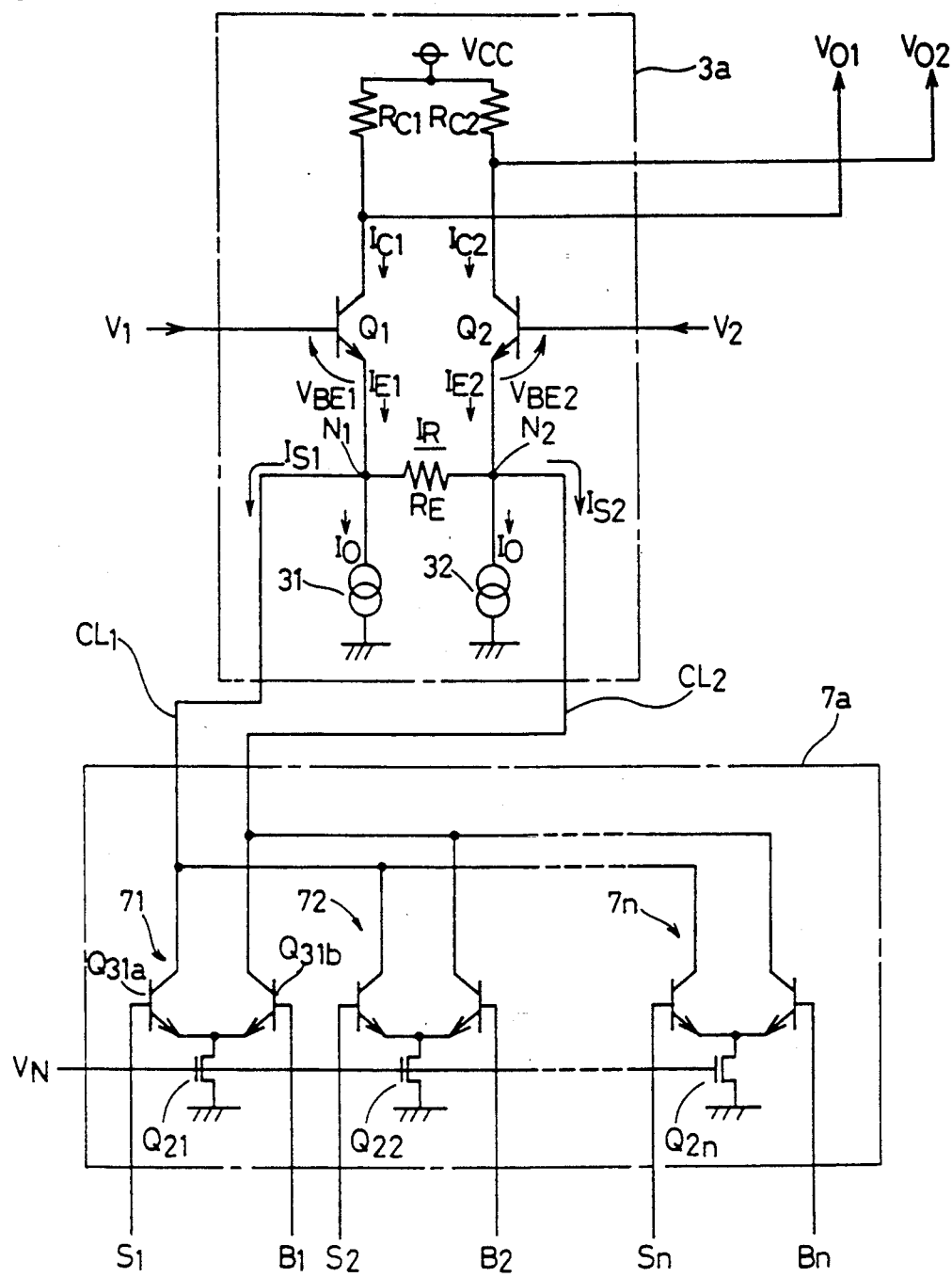
FIG. 1 is a schematic diagram of a differential subtracter and a D/A converter of a first embodiment of the invention.
Figure 5:
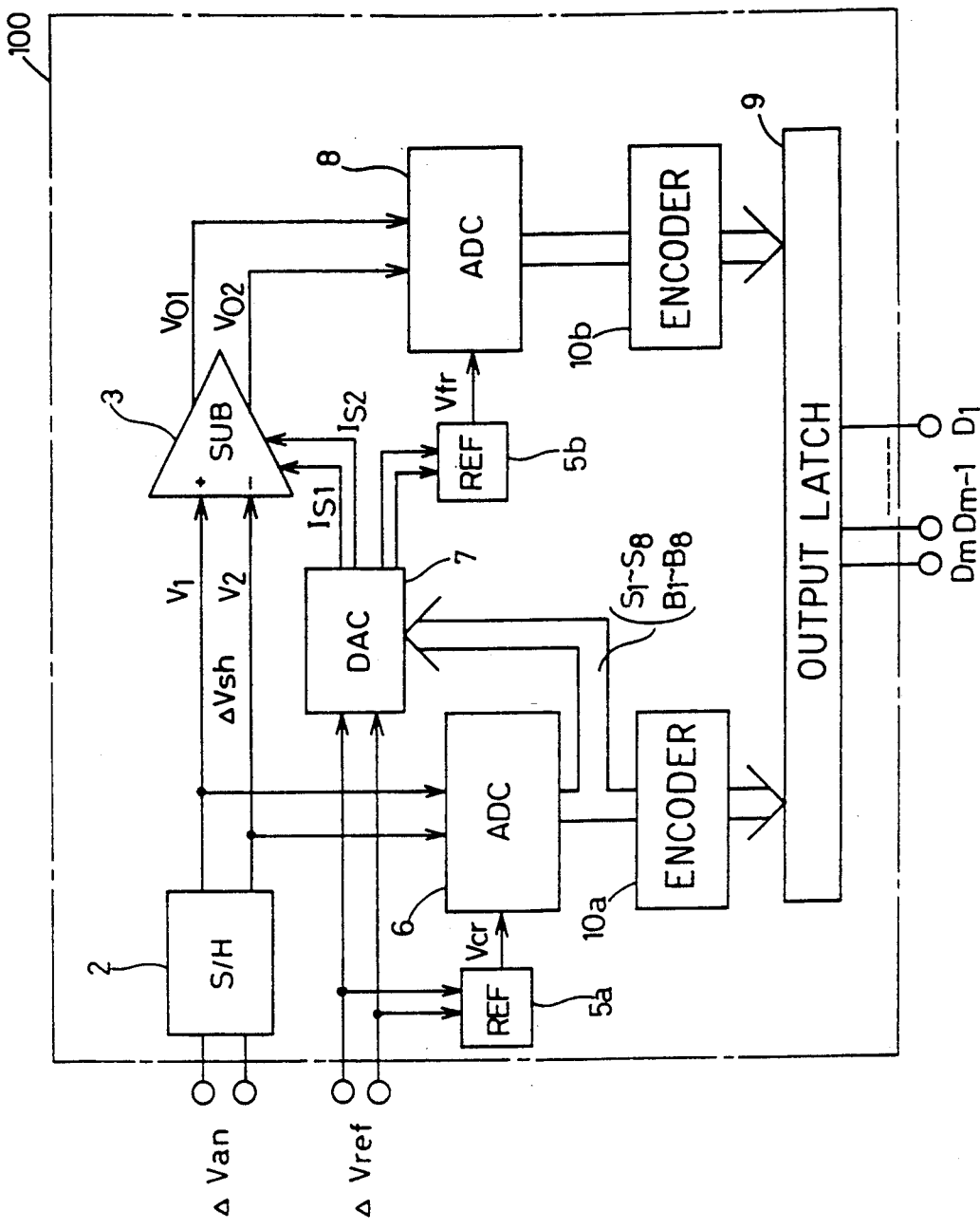
FIG. 5 is a block diagram of a two-step parallel A/D converter in the prior art.
Figure 6:
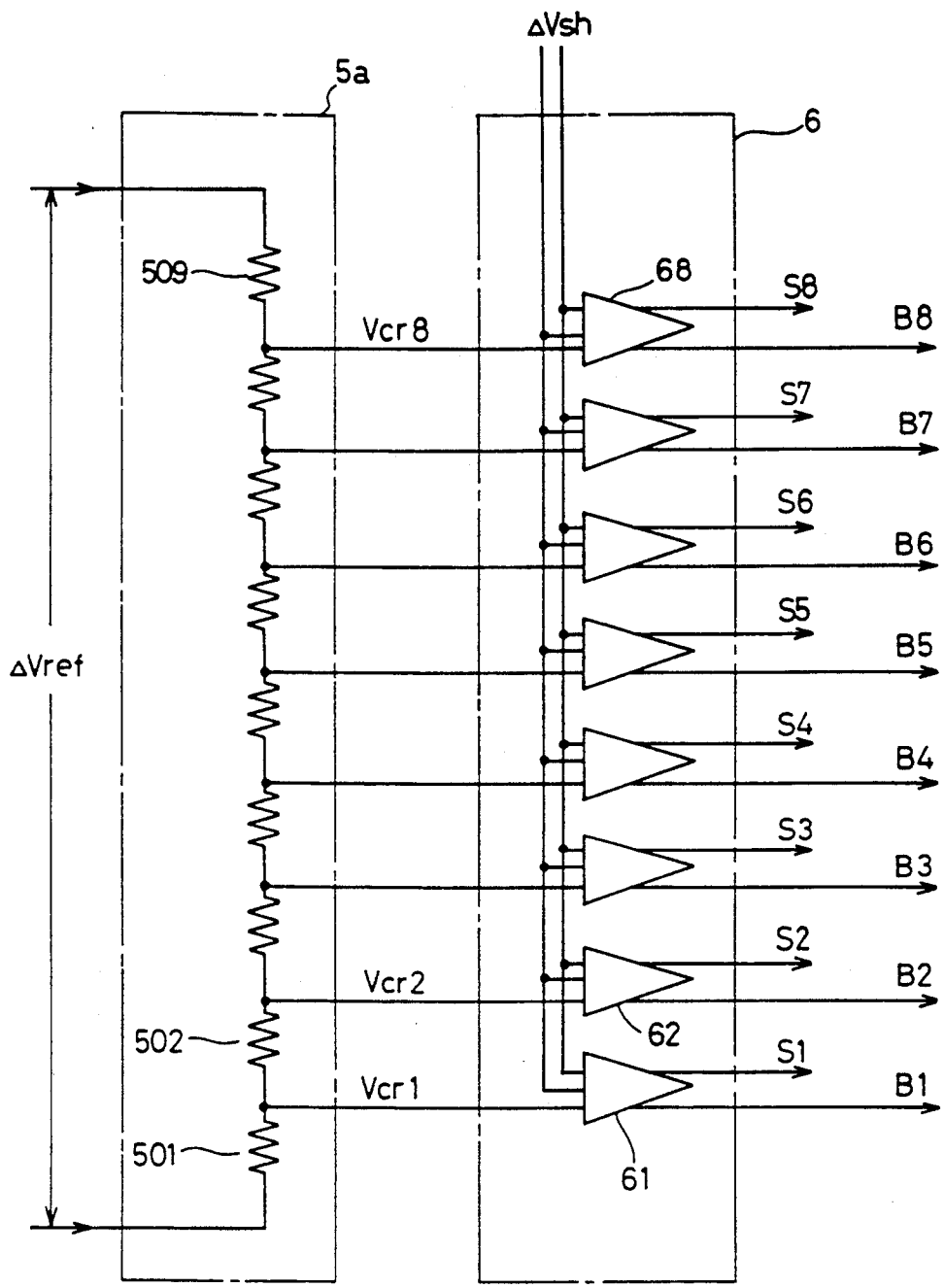
FIG. 6 is a schematic diagram of a coarse reference voltage generating circuit and a higher bit A/D converter shown in FIG. 5.
Figure 7:
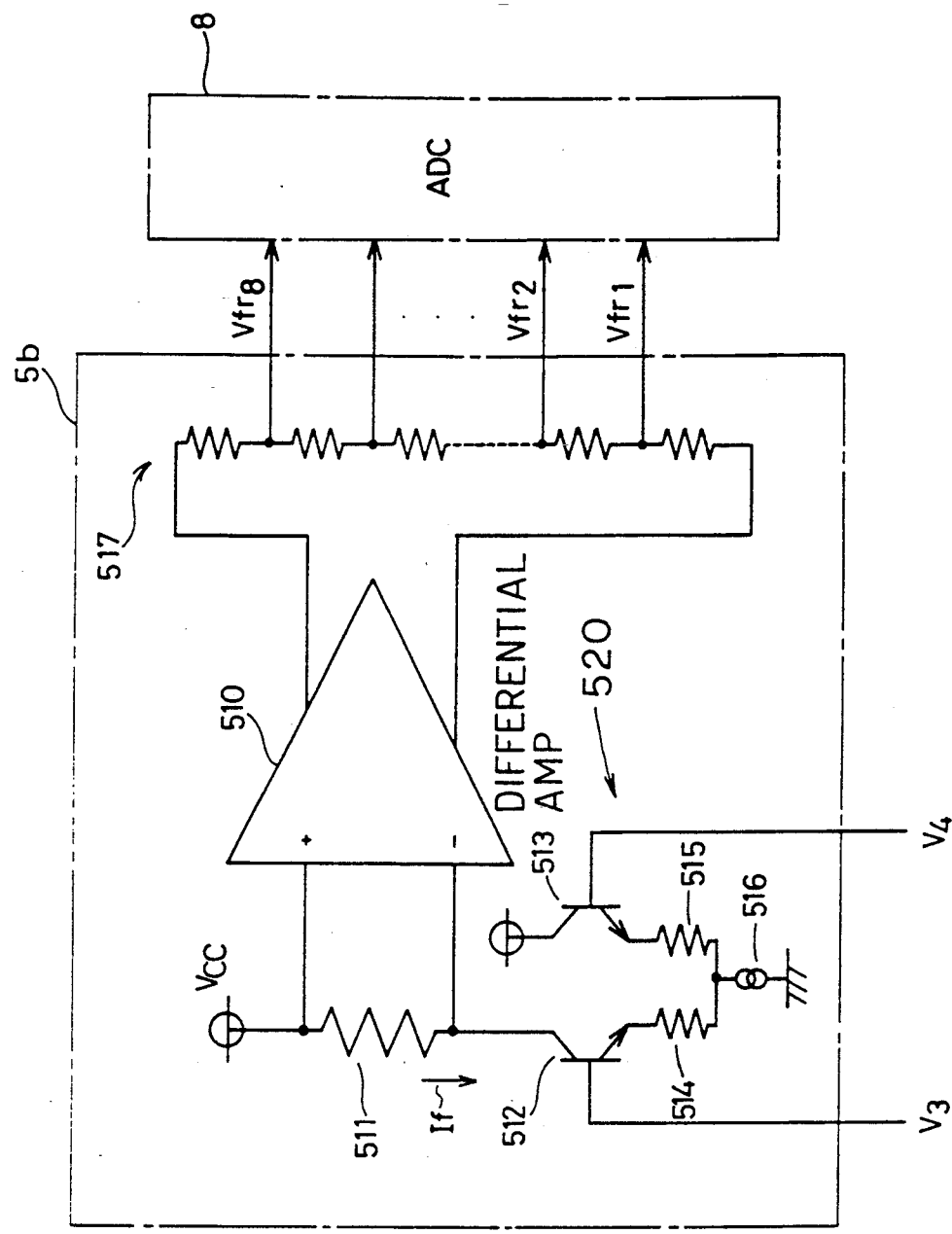
FIG. 7 is a schematic diagram of a fine reference voltage generating circuit shown in FIG. 5.

Referring to FIG. 1, a differential subtracter circuit 3a and a D/A converter 7a can be applied to in the two-step parallel A/D converter 100 shown in FIG. 5 instead of the differential subtracter 3 and D/A converter 7. The differential subtracter 3a shown in FIG. 1 includes npn transistors Q1 and Q2, an emitter transistor $R_E$, collector resistors Rc1 and Rc2, and constant power supplies 31 and 32.

The transistor Q1 has a base electrode connected to receive the voltage V1 from the sample hold circuit 2 shown in FIG. 5. The transistor Q2 has a base electrode connected to receive the voltage V2. The emitter resistor $R_E$ is connected between emitter electrodes of the transistors Q1 and Q2. Collector resistors Rc1 and Rc2 are respectively connected between the supply potential and the collector electrode of the corresponding transistors Q1 and Q2. Constant current supplies 31 and 32 are respectively connected between the ground potential and the emitter electrode of the corresponding transistors Q1 and Q2. A common connection node N1 of the constant current supply 31 and the emitter electrode of transistor Q1 is connected through a current line CL1 to the D/A converter 7a. Likewise, a common connection node N2 of the constant current supply 32 and the emitter electrode of transistor Q2 is connected through a current line CL2 to the D/A converter 7a.

The D/A converter 7a includes subtraction current generating circuit 71, 72, ..., 7n, each of which includes an NMOS transistor and two npn transistors having emitter electrodes connected together. For example, the subtraction current generating circuit 71 includes the npn transistors Q31a and Q31b as well as the NMOS transistor Q21 which forms the constant current supply. The NMOS transistors Q21–Q2n in the subtraction current generating circuit 71–7n have gate electrodes which are connected to receive a predetermined bias voltage $V_N$, whereby the corresponding constant current supplies are formed.

The D/A converter 7a draws the subtraction currents Is1 and Is2 from the subtracter 3a based on the complementary digital signals S1–Sn and B1–Bn indicative of the result of conversion of higher bits. Thereby, ranges of changes of the output voltages Vo1 and Vo2 of the differential subtracter 3a are shifted into ranges which allows processing by the lower bit A/D converter 8 shown in FIG. 5.

Figure 8:
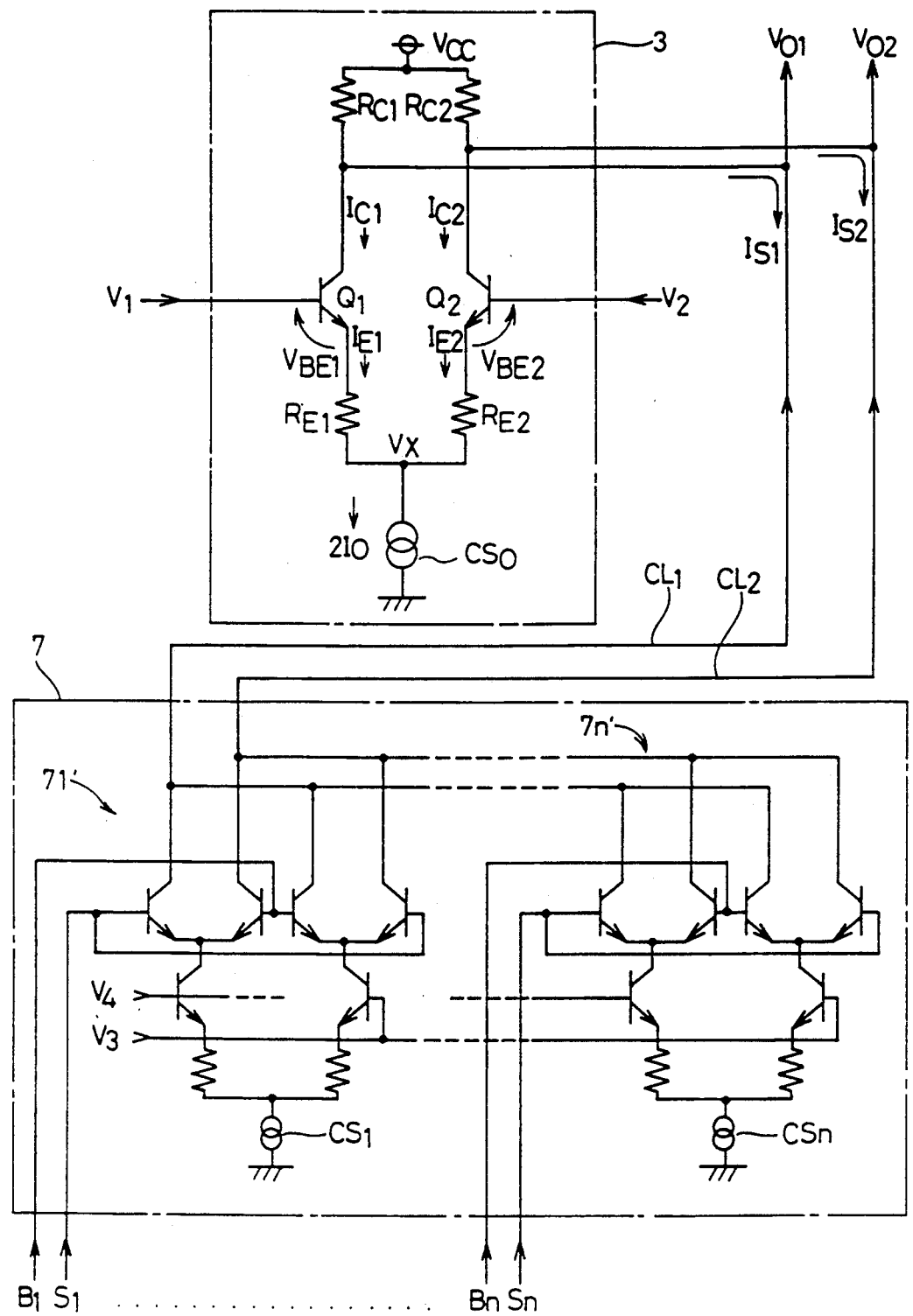
FIG. 8 is a schematic diagram of a differential subtracter and a D/A converter in the prior art shown in FIG. 5.
Figure 9:
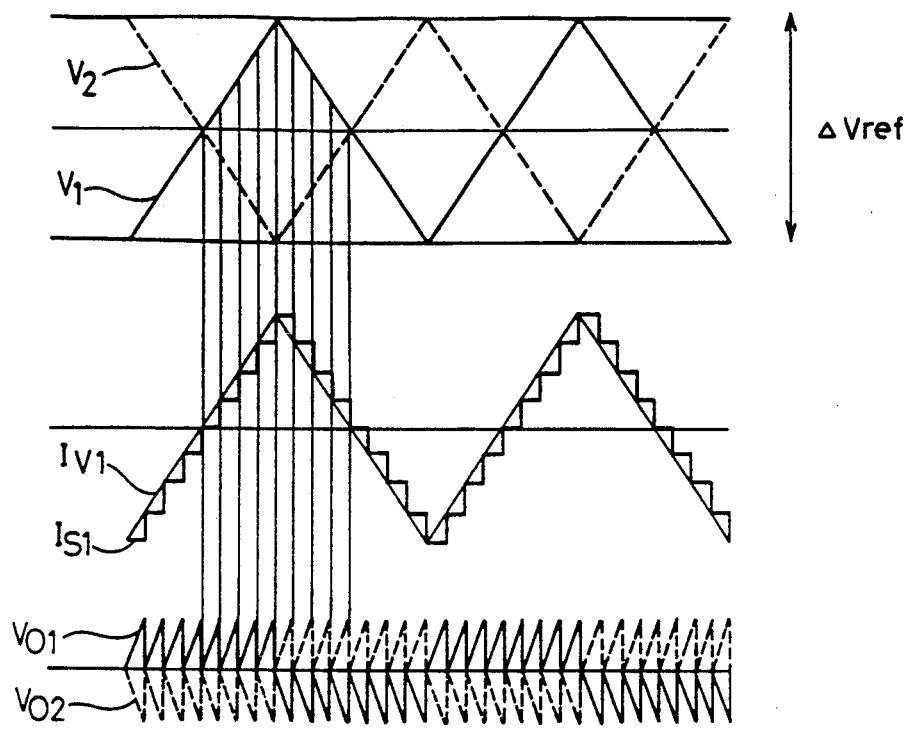
FIG. 9 is a signal waveform diagram for showing an operation of a differential subtracter shown in FIG. 5.
Figure 10:
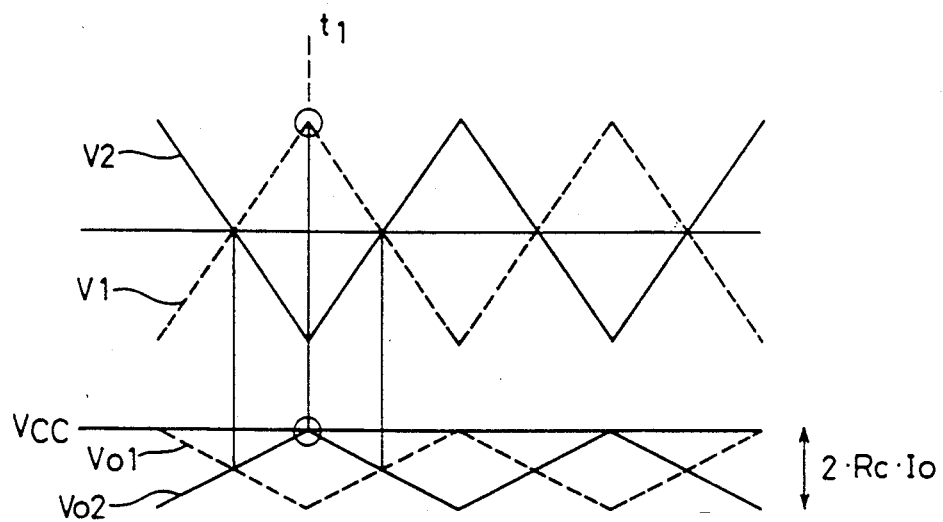
FIG. 10 is a waveform diagram showing changes of a differential input voltages ΔVan and output voltages Vo1 and Vo2 when subtraction currents Is1 and Is2 are 0.

Compared with the conventional differential subtracter 3 shown in FIG. 8, the differential subtracter 3a shown in FIG. 1 has a feature that the subtraction currents Is1 and Is2 are drawn through the nodes N1 and N2 from the differential subtracter 3a. Further, it has a second feature that the emitter resistor $R_E$ is connected between the emitter electrodes of the transistors Q1 and Q2. These features bring about following advantages.

First, when V1=V2, it holds $I_{E1}=I_{E2}=Ic1=Ic2=I0$, so that the output voltages Vo1 and Vo2 has a relationship of Vo1=Vo2.

When V1>V2, the following expressions hold, where $I_R$ indicates a current flowing through the emitter resistor $R_E$.

$$I_{E1} = I0 + I_R \tag{9}$$

$$I_{E2} = I0 - I_R \tag{10}$$

$$I_R = \{(V1 - V_{BE1}) - (V2 - V_{BE2})\}/R_E \tag{11}$$

In the differential subtracter 3a shown in FIG. 1, the emitter currents $I_{E1}$ and $I_{E2}$ also increase in proportion to the base voltages V1 and V2. Therefore, if the base voltage V1 is much larger than the base voltage V2, the current $I_{E1}$ tends to be much larger than the current $I_{E2}$. In practice, however, the D/A converter 7a serves to draw the larger subtraction current Is1 through the node N1, and also serves to draw the smaller subtraction current Is2 through the node N2, so that the difference between the emitter currents $I_{E1}$ and $I_{E2}$ is small.

As a result, there exists a relationship of $V_{BE1} \approx V_{BE2}$ in spite of the fact that the voltage $V_{BE}$ across the base and emitter electrodes of the transistor changes in accordance with the relationship expressed by the foregoing expression (5), because there is little difference between the emitter currents $I_{E1}$ and $I_{E2}$ of the transistors Q1 and Q2. Therefore, the differential subtracter 3a can execute the subtraction with higher accuracy, compared with the conventional differential subtracter 3 shown in FIG. 8.

Provision of the D/A converter 7a having the circuit structure shown in FIG. 1 can also achieve the following advantage. As can be seen from FIG. 1, the collector electrode, e.g., of transistor Q31 in the subtraction current generating circuit 71 is connected to the emitter electrode of transistor Q1. Each of the transistors Q1 and Q31a must receive at its base electrode the bias voltage, which is formed of the base-emitter voltage $V_{BE}$ exceeding about 0.7 V, in order to ensure the operation in the preferable operation range. The D/A converter 7a shown in FIG. 1 can easily satisfy these conditions by using the NMOS transistors as the transistors Q21–Q2n forming the constant current supplies. More specifically, the voltage difference lost by each of the NMOS transistors Q21–Q2n is generally smaller than that by a bipolar transistor. This relaxes the conditions for the base/emitter voltages required in the transistors Q1–Q31a.

Figure 2:
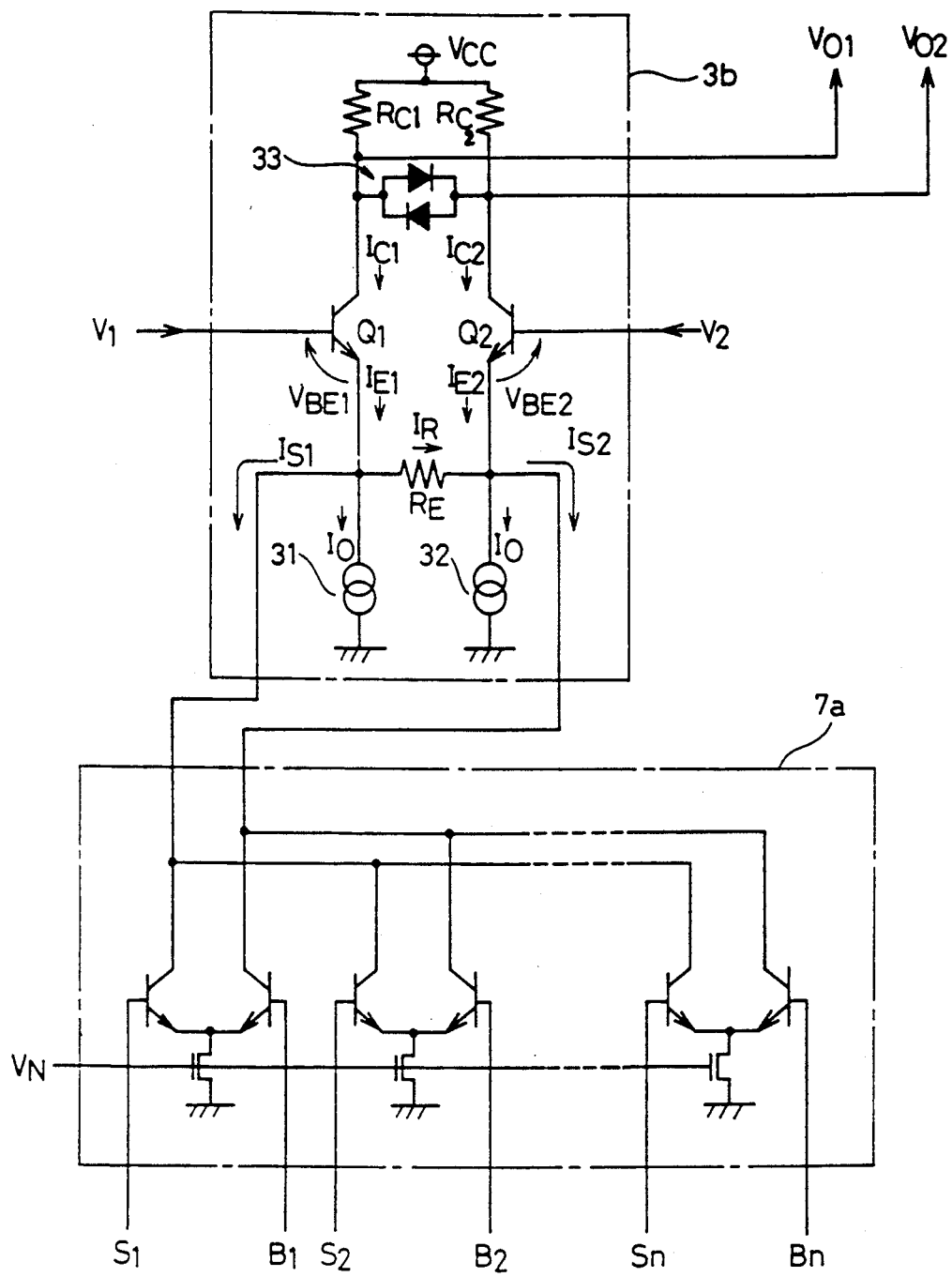
FIG. 2 is a schematic diagram of a differential subtracter and a D/A converter of a second embodiment of the invention.

FIG. 2 is a circuit diagram of a differential subtracter circuit 3b of a second embodiment of the invention. Referring to FIG. 2, the differential subtracter circuit 3b includes a clamping circuit 33 for restricting the amplitudes of the output voltages Vo1 and Vo2 within predetermined ranges, in addition to those included in the differential subtracter 3a shown in FIG. 1. The clamping circuit 33 includes two diodes which are bidirectionally connected in parallel. Each diode has a forward voltage $V_D (=V_{BE1}=B_{Be2})$. Other circuit structures are similar to those shown in FIG. 1, and thus will not be described hereinafter. The provision of clamping circuit 33 brings about an additional advantage described below.

Figure 11:
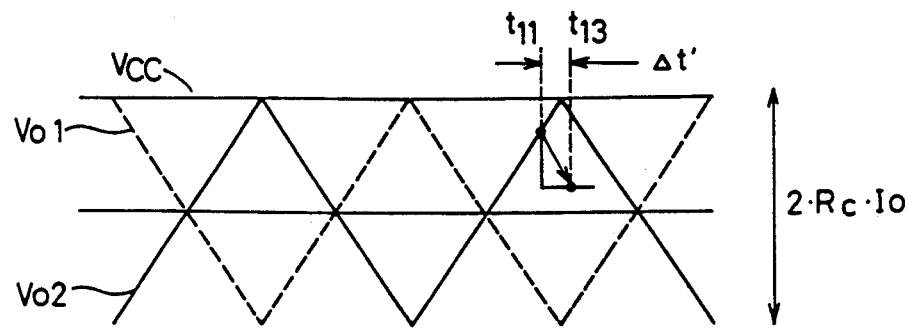
FIG. 11 is an enlarged waveform diagram of output voltages Vo1 and Vo2 shown in FIG. 10.
Figure 12:
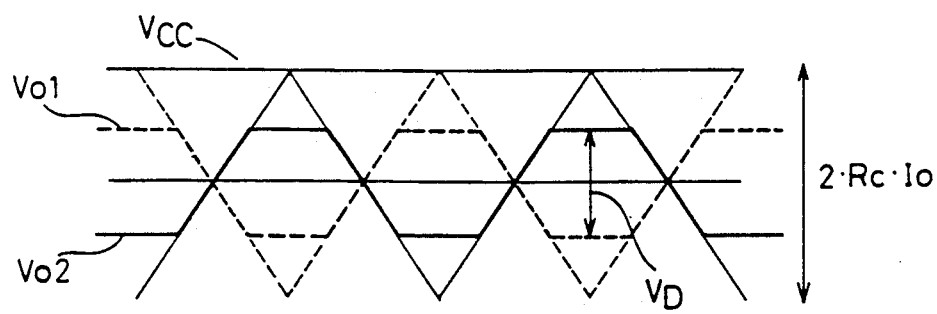
FIG. 12 is an enlarged waveform diagram of output voltages Vo1 and Vo2 of a differential subtracter shown in FIG. 2.

FIG. 12 is an enlarged waveform diagram of the output voltages Vo1 and Vo2 of the differential subtracter 3b shown in FIG. 2. As can be seen from FIG. 12, the output voltages Vo1 and Vo2 change within a range of the voltage $V_D$, and in other words, have the amplitude $V_D$, as can be seen from the comparison with the waveform diagram shown in FIG. 11.

Under the same conditions as those in FIG. 11, therefore, a time period from the time t11 to the time t12, at which the output voltage Vo2 reaches the level indicative of the result of subtraction, can be reduced by a time length Δt. Since the amplitude of the output voltage Vo2 is restricted, the output voltage Vo2 can reach the level indicative of the result of subtraction in a short time. Since the time period required for the subtraction in the differential subtracter is reduced, as described above, high accuracy can be ensured in the high-speed processing, and thus the A/D conversion with high accuracy can be executed also for the lower bits.

Figure 3:
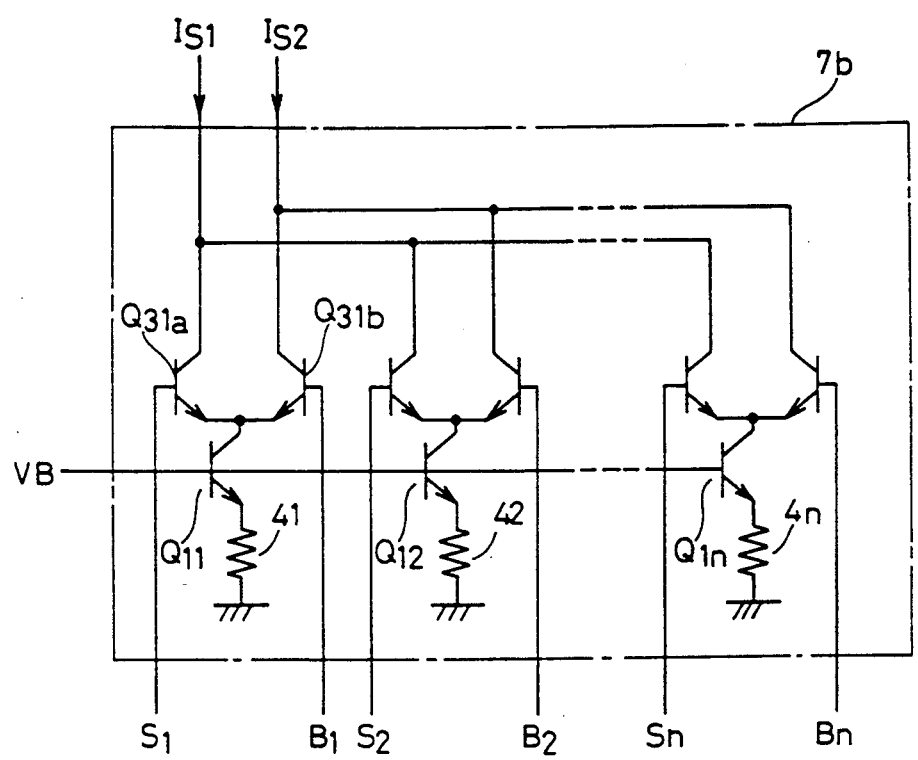
FIG. 3 is a schematic diagram of a D/A converter of a third embodiment of the invention.

FIG. 3 is a circuit diagram showing a D/A converter 7b of a third embodiment of the invention. The D/A converter 7a shown in FIGS. 1 and 2 can be replaced by the D/A converter 7b in FIG. 3. Referring to FIG. 3, the D/A converter 7b includes npn transistors Q11, Q12, ..., Q1n as well as resistors 41, 42, ..., 4n, instead of the NMOS transistors Q21-Q2n. The transistors Q11-Q1n have base electrodes each being connected to receive a predetermined bias voltage $V_B$. Each pair of the npn transistor and resistor form the constant current supply.

Figure 4:
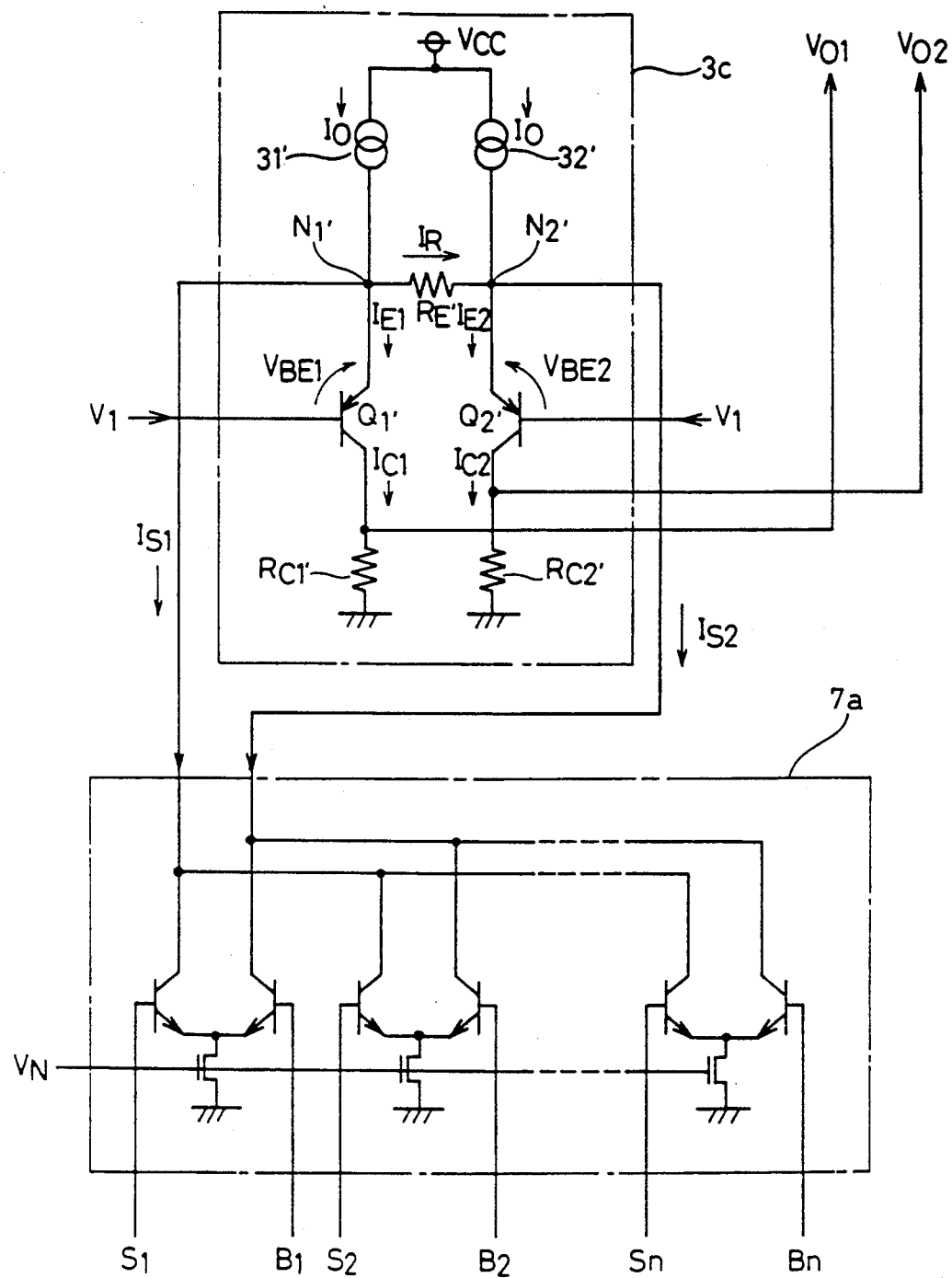
FIG. 4 is a schematic diagram of a differential subtracter and a D/A converter of a fourth embodiment of the invention.

The npn transistors Q1 and Q2 used in the differential subtracters 3a and 3b shown in FIGS. 1 and 2 may be replaced by npn transistors. FIG. 4 is a schematic diagram of a differential subtracter circuit 3c and the D/A converter 7a of a fourth embodiment of the invention. Referring to FIG. 4, the differential subtracter 3c uses npn transistors Q1' and Q2'. Also in this embodiment, the subtraction currents Is1 and Is2 are drawn through the emitter electrodes of the transistors Q1' and Q2', i.e., nodes N1' and N2' shown in FIG. 4. The differential subtracter circuit 3c shown in FIG. 4 operates and functions basically similarly to the differential subtracter 3a shown in FIG. 1. Therefore, use of the differential subtracter 3c shown in FIG. 4 can achieve the high accuracy in the subtraction, and enables the A/D conversion for the lower bits with high accuracy.

In the differential subtracters 3a, 3b and 3c shown in FIGS. 1, 2 and 4, the subtraction currents Is1 and Is2 are drawn through the emitter electrodes of the bipolar transistors, as described above. Therefore, the difference between the bipolar currents $I_{E1}$ and $I_{E2}$ can be significantly reduced, compared with the conventional circuits. Since the emitter currents $I_{E1}$ and $I_{E2}$ are nearly equal to each other, the two base-emitter voltages $V_{BE1}$ and $V_{BE2}$ are nearly equal to each other, as can be understood from the expression (5). Consequently, as can be understood from the expressions (6)-(8), the emitter currents $I_{E1}$ and $I_{E2}$ change in proportion only to the base voltages V1 and V2, resulting in the accurate subtraction.

Figure 13:
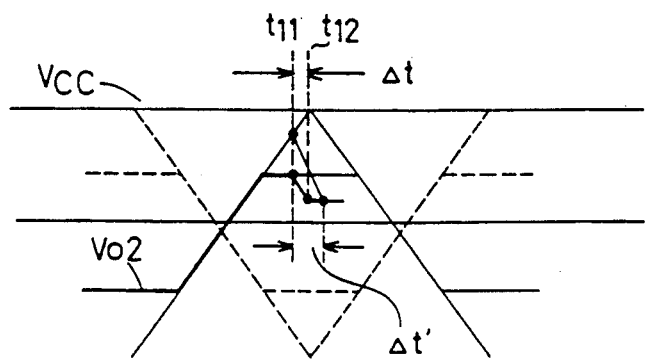
FIG. 13 is an enlarged waveform diagram showing delay in an output voltage of a differential subtracter shown in FIG. 2.

Additionally, the provision of the clamping circuit 33 in the differential subtracter 3b shown in FIG. 2 restricts the amplitudes of the output voltages Vo1 and Vo2 within the predetermined range. This reduces the time period required for the output voltage Vo2 to reach the level indicative of the result of subtraction, as shown in FIG. 13. Therefore, the A/D conversion for the lower bits can be accurately executed at a high speed.

Further, the differential subtracters 3a, 3b and 3c shown in FIGS. 1, 2 and 4 each are provided with the emitter resistor $R_E$ or $R_E'$ connected between the emitter electrodes of the two bipolar transistors, instead of the emitter resistors $R_{E1}$ and $R_{E2}$ shown in FIG. 8. This can prevent the reduction of a dynamic range in which the operation is allowed, as compared with the differential subtracter 3 shown in FIG. 8. In other words, loss of the bias voltage, which is caused by the emitter resistors $R_{E1}$ and $R_{E2}$ in the differential subtracter 3 in FIG. 8, is prevented, and thus the conditions of voltage for supplying the bias voltage can be relaxed.

High A/D conversion accuracy can be achieved by using the differential subtracter and D/A converter shown in FIGS. 1-4 in the two-step parallel A/D converter shown in FIG. 5, instead of the differential subtracter 3 and D/A converter 7.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A differential subtracter circuit for subtracting a second differential signal defined by third and fourth input signals from a first differential signal defined by first and second input signals, comprising:

a first bipolar transistor having a base electrode connected to receive said first input signal and an emitter electrode connected to receive said third input signal;

a second bipolar transistor having a base electrode connected to receive said second input signal and an emitter electrode connected to receive said fourth input signal;

a first constant current source connected between a first supply potential and said emitter electrode of said first bipolar transistor;

a second constant current source connected between said first supply potential and said emitter electrode of said second bipolar transistor;

first resistor means connected between a second supply potential and a collector electrode of said first bipolar transistor;

second resistor means connected between said second supply potential and a collector electrode of said second bipolar transistor; and emitter resistor means connected between said emitter electrodes of said first and second bipolar transistors, wherein a subtraction differential signal indicative of a result of subtraction is outputted through said collector electrodes of said first and second bipolar transistors.

2. The differential subtracter circuit according to claim 1, further comprising amplitude restricting means connected between said collector electrodes of said first and second bipolar transistors for restricting an amplitude of said subtraction differential signal within a predetermined range.

3. The differential subtracter circuit according to claim 2, wherein said amplitude restricting means includes first and second diode means bidirectionally connected in parallel between said collector electrodes of said first and second bipolar transistors.

4. The differential subtracter circuit according to claim 1, wherein said first and second bipolar transistors are first and second npn transistors, respectively.

5. The differential subtracter circuit according to claim 1, wherein said first and second bipolar transistors are first and second pnp transistors, respectively.

6. An A/D converter for converting an input differential signal defined by first and second input signals into a digital signal including a higher bit signal and a lower bit signal, comprising:
means for generating a plurality of coarse reference voltages and a plurality of fine reference voltages for A/D conversion;
first A/D converter means for comparing said input differential signal with said plurality of coarse reference voltages to output said higher bit signal;
D/A converter means for converting said higher bit signal into a corresponding middle differential signal defined by first and second middle signals;
differential subtracter means for subtracting said middle differential signal from said input differential signal to output a subtraction differential signal; and
second A/D converter means for comparing said subtraction differential signal with said plurality of fine reference voltages to output said lower bit signal, wherein
said differential subtraction means includes:
a first bipolar transistor having a base electrode connected to receive said first input signal and an emitter electrode connected to receive said first middle signal;
a second bipolar transistor having a base electrode connected to receive said second input signal and an emitter electrode connected to receive said second middle signal;
a first constant current supply connected between a first supply potential and said emitter electrode of said first bipolar transistor;
a second constant current supply connected between said first supply potential and said emitter electrode of said second bipolar transistor;
first resistor means connected between a second supply potential and a collector electrode of said first bipolar transistor; and
second resistor means connected between said second supply potential and a collector electrode of said second bipolar transistor; wherein
said subtraction differential signal is supplied to said second A/D converter means through said collector electrodes of said first and second bipolar transistors.

7. The A/D converter according to claim 6, wherein said differential subtracter means further includes emitter resistor means connected between emitter electrodes of said first and second bipolar transistors.

8. The A/D converter according to claim 6, wherein said differential subtracter means further includes amplitude restricting means connected between collector electrodes of said first and second bipolar transistors for restricting an amplitude of said subtraction differential signal within a predetermined range.

9. The A/D converter according to claim 8, wherein said amplitude restricting means includes first and second diode means bidirectionally connected in parallel between said collector electrodes of said first and second bipolar transistors.

10. The A/D converter according to claim 6, wherein said first A/D converter means includes a plurality of comparator means each provided for comparing said input differential signal with corresponding one of said coarse reference signals, said comparator means being provided for supplying a thermometer code signal as said higher bit signals.

11. The A/D converter according to claim 10, wherein said A/D converter means includes current difference forming means which is responsive to said thermometer code signal to form a difference between currents which define said first and second middle signals, respectively.

12. The A/D converter according to claim 11, wherein
said thermometer code signal is defined by first and second complementary signals; and
said current difference forming means includes:
a third bipolar transistor having an emitter electrode connected to receive said first complementary signal,
a fourth bipolar transistor having an emitter electrode connected to receive said second complementary signal,
said third and fourth bipolar transistors having the emitter electrodes connected together,
a third constant current supply connected between said second supply potential and said emitter electrodes of said third and fourth bipolar transistors, and
said first and second middle signals being supplied through collector electrodes of said third and fourth bipolar transistors.

13. The A/D converter according to claim 12, wherein said third constant current supply includes a field effect transistor connected between said second supply potential and said emitter electrodes of said third and fourth bipolar transistors, and said field effect transistor having a gate electrode connected to receive a predetermined control voltage.

14. The A/D converter according to claim 6, wherein said A/D converter is a two-step parallel A/D converter.

15. A differential subtracter circuit for subtracting a second differential signal defined by third and fourth input signals from a first differential signal defined by first and second input signals, comprising:
a first bipolar transistor having a base electrode connected to receive said first input signal and an emitter electrode connected to receive said third input signal;
a second bipolar transistor having a base electrode connected to receive said second input signal and an emitter electrode connected to receive said fourth input signal;
a first constant current source connected between a first supply potential and said emitter electrode of said first bipolar transistor;
a second constant current source connected between said first supply potential and said emitter electrode of said second bipolar transistor;

first resistor means connected between a second supply potential and a collector electrode of said first bipolar transistor;

second resistor means connected between said second supply potential and a collector electrode of said second bipolar transistor; and amplitude restricting means connected between said collector electrodes of said first and second bipolar transistors for restricting an amplitude of said subtraction differential signal within a predetermined range, wherein a subtraction differential signal indicative of a result of subtraction is outputted through said collector electrodes of said first and second bipolar transistors.

16. The differential subtracter circuit according to claim 15, wherein said amplitude restricting means includes first and second diode means bidirectionally connected in parallel between said collector electrodes of said first and second bipolar transistors.

* * * * *